(12) United States Patent
Okada et al.

(10) Patent No.: US 9,607,868 B2
(45) Date of Patent: Mar. 28, 2017

(54) SUBSTRATE HEAT TREATMENT APPARATUS

(71) Applicant: CANON ANELVA CORPORATION, Kawasaki-shi (JP)

(72) Inventors: Takuji Okada, Kawasaki (JP); Toshikazu Nakazawa, Kawasaki (JP); Naoyuki Suzuki, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 957 days.

(21) Appl. No.: 13/915,712

(22) Filed: Jun. 12, 2013

(65) Prior Publication Data

US 2013/0272686 A1 Oct. 17, 2013

Related U.S. Application Data

(63) Continuation of application No. PCT/JP2010/073019, filed on Dec. 21, 2010.

(51) Int. Cl.
*F26B 3/30* (2006.01)
*H01L 21/67* (2006.01)
*H01L 21/687* (2006.01)

(52) U.S. Cl.
CPC .. *H01L 21/67115* (2013.01); *H01L 21/67103* (2013.01); *H01L 21/68721* (2013.01); *H01L 21/68742* (2013.01)

(58) Field of Classification Search
CPC ......... H01L 21/67103; H01L 21/68742; H01L 21/68721; H01L 21/67115

(Continued)

(56) References Cited

U.S. PATENT DOCUMENTS 6,163,648 A 12/2000 Moto et al.
6,462,411 B1 10/2002 Watanabe et al.
(Continued)

FOREIGN PATENT DOCUMENTS

JP H07-254545 A 10/1995
JP H11-176822 A 7/1999
(Continued)

OTHER PUBLICATIONS

International Search Report in PCT/JP2010/073019, issued Jan. 25, 2011 (4 pages).
(Continued)

*Primary Examiner* — Phuong Nguyen
(74) *Attorney, Agent, or Firm* — Fitzpatrick, Cella, Harper & Scinto (57) ABSTRACT

The present invention provides a substrate heat treatment apparatus capable of uniformly heat a substrate at high speed with less breakage of constituent members due to thermal expansion even at high temperature. An embodiment of the present invention is a substrate heat treatment apparatus to perform heat treatment for a substrate and includes: a peripheral ring capable of supporting the substrate; a connection ring; a lifting device to raise and lower the peripheral ring; balls having a lower heat conductivity than that of the peripheral ring; and a lamp to heat the substrate supported by the peripheral ring. The balls are different members from both of the peripheral ring and the connection ring. The lifting device raises and lowers the peripheral ring between a first position close to the lamp and a second position distant from the lamp.

3 Claims, 8 Drawing Sheets

(58) Field of Classification Search
USPC ....... 392/418, 416, 407, 422, 449, 450, 411,
392/417, 432, 544; 219/444.1, 544, 411,
219/494, 385, 209, 702, 756
See application file for complete search history.

(56) References Cited

U.S. PATENT DOCUMENTS

| | | | |
|---|---|---|---|
| 8,378,576 | B2 | 2/2013 | Abarra et al. |
| 2007/0025708 | A1* | 2/2007 | Lee ................... H01L 21/67103 |
| | | | 392/418 |
| 2009/0078202 | A1* | 3/2009 | Strikovski ............. C23C 14/541 |
| | | | 118/725 |
| 2010/0226630 | A1 | 9/2010 | Shibagaki |
| 2011/0253037 | A1* | 10/2011 | Tsunekawa ....... H01L 21/67109 |
| | | | 118/50 |

FOREIGN PATENT DOCUMENTS

| | | | | |
|---|---|---|---|---|
| JP | 2000-058471 A | | 2/2000 | |
| JP | 2002-110581 A | | 4/2002 | |
| JP | 2007-180331 A | | 7/2007 | |
| JP | 2009234927 | * | 10/2009 | ........... C07C 69/003 |
| JP | 2010-123637 A | | 6/2010 | |
| JP | 2010-205922 A | | 9/2010 | |
| JP | 2010-238788 A | | 10/2010 | |

OTHER PUBLICATIONS

International Preliminary Report on Patentability in PCT/JP2010/073019, issued Jun. 25, 2013 (6 pages).

* cited by examiner

SUBSTRATE HEAT TREATMENT APPARATUS

CROSS-REFERENCE TO RELATED APPLICATIONS

This application is a continuation application of International Application No. PCT/JP2010/073019, filed Dec. 21, 2010. The contents of the aforementioned application is incorporated herein by reference in its entirety.

TECHNICAL FIELD

The present invention relates to a substrate heat treatment apparatus used in electronic device manufacturing processes and the like.

BACKGROUND ART

As a conventional mechanism to heat a substrate, PTL 1 has proposed a mechanism in which the substrate is heated while being supported by supporting pins integrated with a lifting device and being located closer to a heating plate. In the technique disclosed in PTL 1, the heating plate is placed in an upper part of a vacuum unit, and the lifting device including the supporting pins is provided under the heating plate. In the process of heating the substrate, the substrate is placed on the supporting pins, and then the lifting device is driven to raise the supporting pins, so that the substrate is located closer to the heating plate and is heated.

On the other hand, there is another proposition for fast heating that, in order to obtain uniform wafer temperature with a lamp heater, a ring-shaped component having a slightly larger diameter than that of the wafer (hereinafter, referred to as a guard ring) is provided to the periphery of the wafer (PTL 2). When the wafer is heated by a lamp located opposite to the wafer, the surface temperature of the wafer is normally highest at the wafer center, and radiant heat causes heat of the wafer release to the environment, so that the temperature is low at the outer edge. If the peripheral ring is provided, the wafer outer edge is integrally joined to the peripheral ring, and the heat radiation can be reduced. This can improve the uniformity of wafer temperature.

In the conventional technique, the guard ring is placed at a predetermined position in the apparatus, and each wafer to be processed is delivered by a delivery mechanism. The wafer and guard ring are located with a predetermined positional relationship, and lamp light is then projected to heat the wafer. The processed wafer is carried out in a similar manner. In the case of a heating process to heat wafers at multiple positions depending on various purposes, for example, the positional relationship between the peripheral ring and the wafer is changed among the positions (where the distance between the lamp and a wafer at irradiation is changed) in the above structure. If the position of the peripheral ring is changed to avoid the aforementioned situation, the mechanism must be complicated and, moreover a problem of reliability is caused.

The guard ring, which is used to obtain the uniformity of temperature of the heated wafer, is therefore desirably made of the same material as wafers. However, the guard ring is repeatedly used (heated) unlike wafers. Therefore, another durable material having thermal characteristics (the specific heat and thermal conductivity) close to the wafer is often selected for the guard ring.

One of the reasons thereof is that it is difficult to provide a forced cooling device for the guard ring because of the mechanical restriction. Especially in an apparatus for processing in vacuum, the absence of a cooling device leads to an undesired temperature increase of the guard ring, a temperature difference between the guard ring and the wafer before processing, and changes thereof with time, which could also influence the process. The guard ring is intended to prevent or reduce temperature increases and damages of components by not only providing uniformity in wafer temperature, but also blocking lamp light traveling toward a lower part of the chamber.

CITATION LIST

Patent Document

Patent Document 1: Japanese Patent Application Laid-Open No. 7-254545
Patent Document 2: Japanese Patent Application Laid-Open No. 2000-58471

SUMMARY OF INVENTION

Technical Problem

In order to perform fast heating in the heating apparatus including the lifting device, which is disclosed in PTL 1, it is necessary to reduce heat escaping from the edge of the wafer. However, provision of the guard ring disclosed in PTL 2 around the wafer in the heating apparatus according to PTL 1 requires another mechanism (a lifting device) to move up and down the guard ring. In other words, it is necessary to connect the guard ring to the shaft of the lifting device.

Implementation of the above mechanism (the lifting device), in which the guard ring supports a wafer and is moved up and down by an actuator or the like involves the following problems.

The first problem is a problem of thermal expansion. The guard ring is directly irradiated with heat and is heated to a high temperature over 500° C., for example, in the process as is the case with the wafer. The guard ring is usually made of a brittle material such as ceramics, and the lifting device that moves up and down the guard ring is made of a metallic material such as stainless. Ceramics of the guard ring and a metallic material of the lifting device have a difference in the coefficient of thermal expansion of about two to four times, which depends on the combination thereof. Accordingly, the guard ring and lifting device heated to high temperature has a difference in amount of expansion due to heat. When the guard ring is rigidly connected to the shaft of the lifting device, excessive thermal stress or interference between the components due to the different amounts of expansion may cause defects including breakage of the guard ring and fastening components (screws) and deformation of the fastening components (metal). Even though the components are not broken, the deformed components rub against each other and generate particles.

The second problem is a problem of escape of heat through the joint part of the guard ring and the shaft of the lifting device. The wafer is heated to high temperature at the process. As described above, the guard ring blocks lamp light traveling toward a lower part of the chamber and prevents or reduces temperature increases of the components. This causes a great difference in temperature between the upper part and lower part of the guard ring. The temperature difference promotes heat transfer between the guard ring and shaft. This means that heat escapes from the guard ring through the shaft. The escape of heat is a loss in the wafer heating process. Moreover, the guard ring has a role of making the temperature in the wafer uniform. If heat escapes from the joint part of the guard ring and shaft, the in-plane temperature of the guard ring becomes uneven, and the wafer therefore has an uneven distribution of temperature.

The present invention is made in the light of the aforementioned conventional problems, and an object thereof is to provide a substrate heat treatment apparatus which is capable of uniformly heating a substrate at high speed with damage on constituent members due to thermal expansion reduced even at high temperature.

In order to achieve the aforementioned object, an aspect of the present invention is a substrate heat treatment apparatus to perform heat treatment for a substrate, comprising a substrate supporting plate capable of supporting the substrate; a lifting mechanism configured to hold the substrate supporting plate and raise and lower the substrate supporting plate; a linking member linking the substrate supporting plate and the lifting mechanism, the linking member having lower thermal conductivity than that of the substrate supporting plate; and a heating means for heating the substrate supported by the substrate supporting plate from above the substrate supporting plate in the gravity direction, wherein the linking member is a member different from both the substrate supporting plate and the lifting mechanism, and the lifting mechanism includes a raising and lowering means for raising and lowering the substrate supporting plate between a first position close to the heating means and a second position distant from the heating means.

According to the present invention, even if the substrate supporting plate and the lifting mechanism have different coefficients of thermal expansion, it is possible to alleviate the influence thereof and reduce breakage of the constituent members. Moreover, heat escaping between the substrate supporting plate and lifting mechanism is reduced, so that substrates can be heated uniformly at high speed.

DESCRIPTION OF EMBODIMENTS

Hereinafter, a description is given of embodiments of the present invention in detail with reference to the drawings. In the drawings described below, portions having same functions are given same reference numerals, and redundant description is omitted.

First Embodiment

Figure 1:
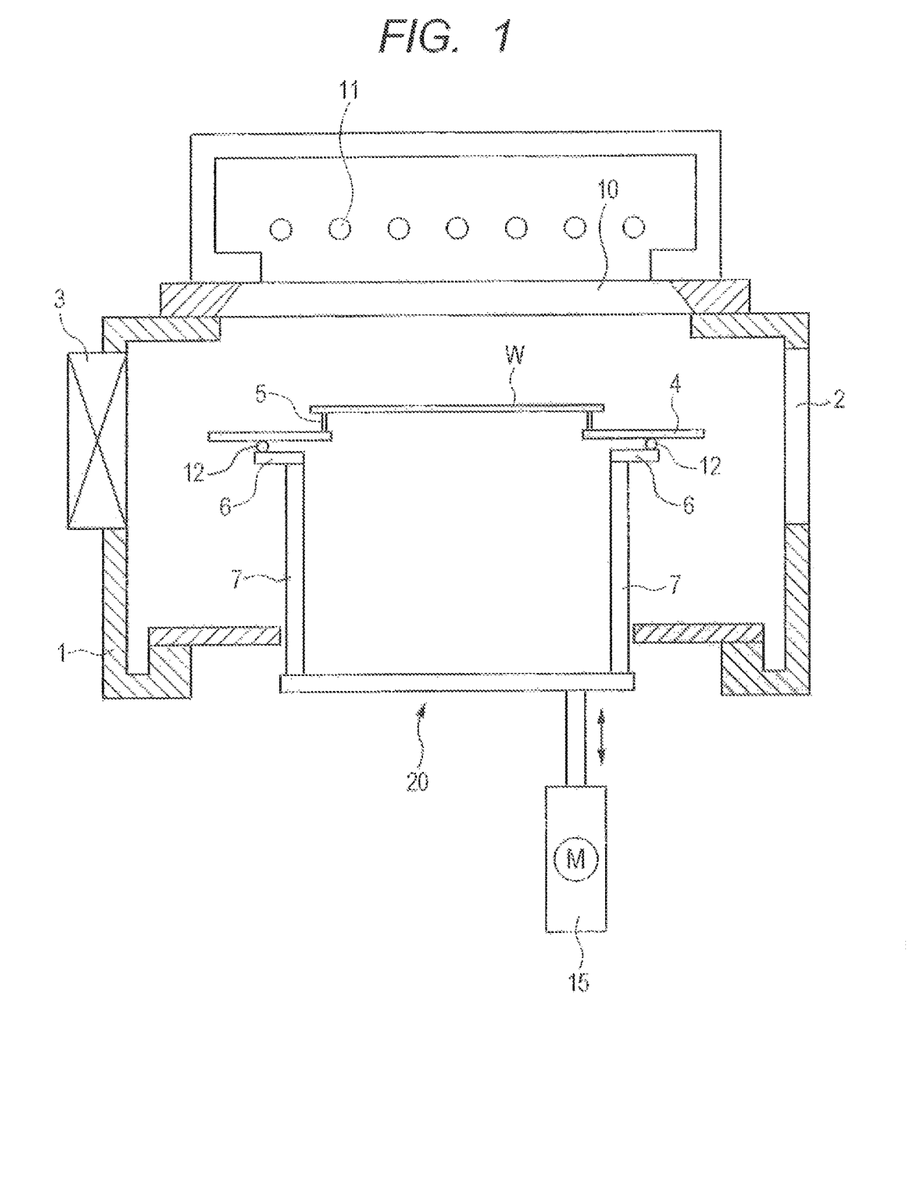
FIG. 1 is a schematic view of a substrate heat treatment apparatus according to one embodiment of the present invention.

FIG. 1 is a schematic view of a substrate heat treatment apparatus according to an embodiment, which performs heat treatment for a substrate. In FIG. 1, reference numeral 1 denotes a chamber; reference numeral 2, an exhaust port; and reference numeral 3, a wafer inlet port for a wafer W. The chamber 1 is connected to an exhaust system through the exhaust port 2. The exhaust system is formed of a vacuum pump, a valve, a gauge, and the like which are properly selected and is capable of evacuating the inside of the chamber 1 to a desired pressure. The wafer W before treatment is carried in from a wafer delivery system through the wafer inlet port 3, and the wafer W after treatment is carried out. In the top wall of the chamber 1, a light inlet window 10 made of a light transmissive material is provided. Above the light inlet window 10 (that is, above the wafer W placed on a later-described peripheral ring 5 in the gravity direction), a lamp 11 as a heating unit is provided. Light of the lamp 11 is incident through the light inlet window to heat the wafer W. The heating unit is not limited to the lamp and may be any structure that is capable of emitting heat and heating a substrate placed away from the same with the emitted heat, such as a heating place.

The peripheral ring 4 as an annular member is a substrate supporting plate for supporting the wafer W and is placed so that the lamp light from the lamp 11 is incident thereon, that is, so that the substrate supporting plate faces the lamp 11. The peripheral ring 4 is provided with wafer supporting pins 5. In this embodiment, the number of wafer supporting pins 5 is three. The peripheral ring 4 is placed on a lifting mechanism 20 with balls 12 as a linking member interposed therebetween. The balls 12 as the linking member are configured to at least slide on the peripheral ring 4, so that the peripheral ring 4 is not rigidly connected to the lifting mechanism 20.

The lifting mechanism 20 includes a connection ring 6, shafts 7, and an actuator 15. The connection ring 6 is a member for holding the peripheral ring 4 (a substrate supporting plate holding portion). The connection ring 6 is fastened to the shafts 7 and is moved up and down by drive of the actuator 15. Specifically, the lifting mechanism 20 is driven by the actuator 14 to lift and lower (move up and down) the peripheral ring held by the connection ring 6 through the balls 12 (that is, the wafer W placed on the peripheral ring). The aforementioned wafer W can be stopped at predetermined positions including a first position closer to the lamp 11 (for example, a heating position) and a second position more distant from the lamp 11 than the first position (for example, a delivery position).

The actuator 15 is a servomotor but may be another means such as an air cylinder. Moreover, to precisely move the shafts 7, a linear motion guide is required. This embodiment is an apparatus to perform lamp heating treatment in vacuum, and the linear motion guide and actuator 15 are installed in the atmosphere outside the chamber. The shafts 7 are therefore vacuum-sealed using a bellows (not shown). In this embodiment, the connection ring 6 is supported by the two shafts 7, but the number of shafts 7 is not limited to tow and may be one or three or more. All of the shafts do not need to be joined to the actuator and driven by the same, and some of the shafts may be used as only the linear motion guide.

As described above, the lamp heating apparatus according to the embodiment includes the peripheral ring 4. The peripheral ring 4 enhances the uniformity of the wafer temperature and blocks the lamp light to the lower part of the chamber while supporting the wafer W. The wafer W is supported by the wafer supporting pins 5 stood on the peripheral ring 4. The peripheral ring 4 is moved up and down by the actuator 15 to change the position of the wafer W for heating and delivery.

Figure 2:
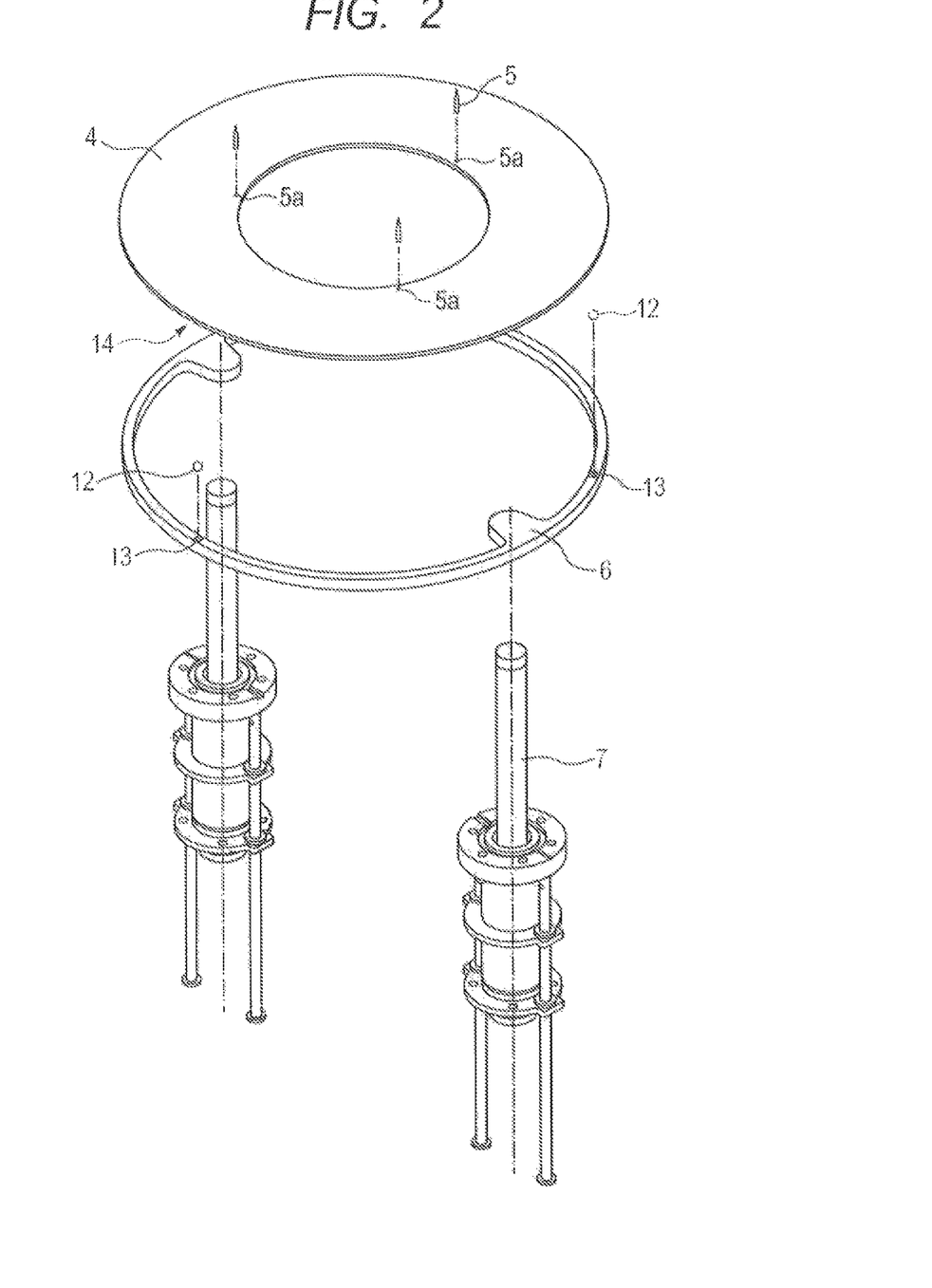
FIG. 2 is a structure view (an exploded view) of a peripheral ring according to one embodiment of the present invention.
Figure 3:
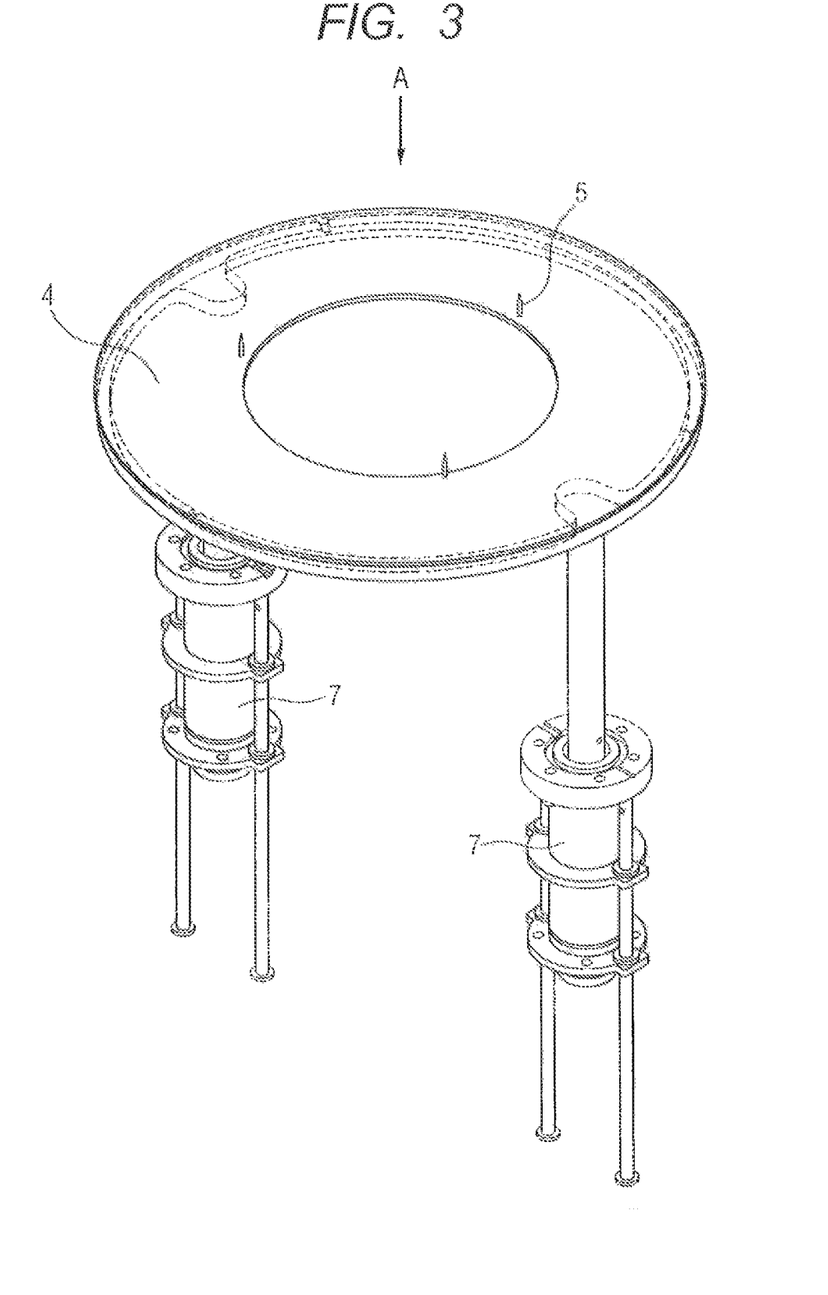
FIG. 3 is a structure view of the peripheral ring according to one embodiment of the present invention.

In other words, this embodiment proposes a mechanism to separate and link the peripheral ring 4 from and to the lifting mechanism 20 which is a structure placed under the peripheral ring 4 and is configured to lift and lower the peripheral ring 4. FIG. 2 is a structure view (an exploded vide) of the peripheral ring 4 according to the embodiment and the part under the same. FIG. 3 is an integrated view for FIG. 2 as the exploded view.

In FIGS. 2 and 3, the peripheral ring 4 is a SiC ring (thermal conductivity: 270 W/m·K) and includes three insertion holes 5a. In the insertion holes 5a, the respective wafer support pins 5 made of SiC (thermal conductivity: 270 W/m·K) are inserted. The wafer W can be supported by the three wafer supporting pins 5. When the wafer W placed on the wafer supporting pins 5 is irradiated by lamp light (heating light) from the lamp 11, the peripheral ring 4 is also heated by the lamp light. Since the peripheral ring 4 has a high thermal conductivity, in this process, the peripheral ring 4 becomes hot by irradiation of the lamp light and radiates heat. The heat radiated from the peripheral ring 4 can act on the outer edge of the wafer W since the outer edge of the wafer W is located opposite to at least the peripheral ring 4. In other words, the peripheral ring 4 heated by the lamp light radiates heat to heat the outer edge of the wafer W. This can reduce temperature of the central part and edge part of the wafer W.

In this embodiment, the shape of the peripheral ring 4 is a ring (annular) shape but is not limited to this shape. The shape of the peripheral ring 5 may be either a disk or a polygon such as a rectangle as long as the shape of the peripheral ring 4 is located opposite to at least the edge of the wafer.

In this embodiment, moreover, the wafer supporting pins 5 are provided to the peripheral ring 4 to support the wafer W. When the wafer W is supported by the substrate supporting plate, therefore, the wafer W and the substrate supporting plate can be in point contact with each other. In a conventional apparatus, the inner circumferential edge of the guard ring is tapered along the circumferential direction. The wafer is placed on the guard ring in such a manner that the tapered portion formed in the circumferential direction is in linear contact with the edge of the wafer. Since the wafer W is placed on the substrate supporting plate through point contact in this embodiment, it is possible to further reduce the transfer of heat due to heat conduction between the wafer W and substrate supporting plate.

Furthermore, in this embodiment, as described above, the peripheral ring 4 as the substrate supporting plate has a function of conventional guard rings as well as the function of supporting a substrate. Accordingly, in the configuration of lifting and lowering both the substrate and guard ring, the relative positional relationship between the substrate and the guard ring does not change.

In this embodiment, the wafer supporting pins 5 are provided in three places. However, the wafer supporting pins 5 may be provided at any number of places, such as four or five places, as long as the wafer W can be stably supported. Specifically, the wafer W can be stably supported by the three-point support of the wafer supporting pins. Accordingly, the wafer supporting pins 5 should be at least three places.

The outer diameter of the connection ring 6 located under the peripheral ring 4 is slightly smaller than that of the peripheral ring 4. By setting the diameter of the connection ring 6 smaller than that of the peripheral ring 4, the lamp light is blocked by the peripheral ring 4, so that the connection ring 6 is prevented from becoming hot or the connection ring 6 is less likely to become hot. The connection ring 6 is fastened to the shafts 7 and is driven up and down by the actuator such as a servomotor. However, the connection ring 6 is not in direct contact with the peripheral ring 4. In this embodiment, the peripheral ring 4 is supported by the connection ring 6 not by plane but with the three balls 12 (linking members) sandwiched by the both components. In the first embodiment, the connection ring 6 is made of SUS (thermal conductivity: 16.7 W/m·K). In this embodiment, the balls 12 as the joint members are provided for the purpose of supporting the peripheral ring 4 and thermally isolating the peripheral ring 4 from the connection ring 6 as a part of the lifting device 20. Accordingly, the balls 12 as the linking members have a smaller thermal conductivity than that of the peripheral ring 4 as the substrate supporting plate.

Figure 4:
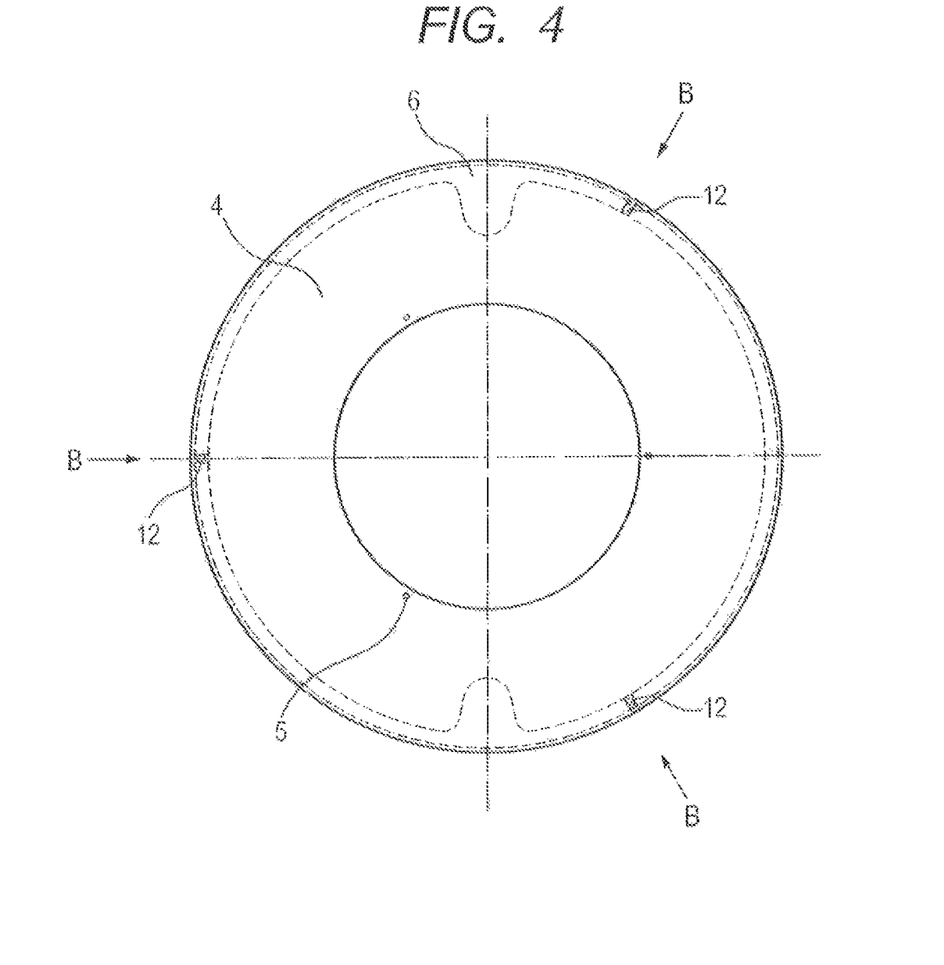
FIG. 4 is a plan view indicated by an arrow A of FIG. 3, showing the peripheral ring according to one embodiment of the present invention.

The balls 12 are made of a material having a smaller heat transfer coefficient than that of the connection ring 6 which is made of quartz or ceramics and are fit in grooves 13 provided in the connection ring 6. In this embodiment, the balls 12 are made of quartz (thermal conductivity: 1.38 W/m·K). As shown in FIG. 4, grooves 13 are provided at three equal intervals on the circumference of the connection ring 6, an the balls 12 are fit in the respective grooves 13 one to one. The depth of each groove 13 is smaller than the diameter of each ball 12. When the balls 12 are fit in the grooves 13, about an upper half of each ball 12 is out of the groove 13. The shape of each groove 13 is an oblong, and the direction of the long axis (the longitudinal direction, that is, the direction that the groove 13 extends) is the same as a radial direction (a direction from the outer edge of the ring toward the center).

Figure 5:
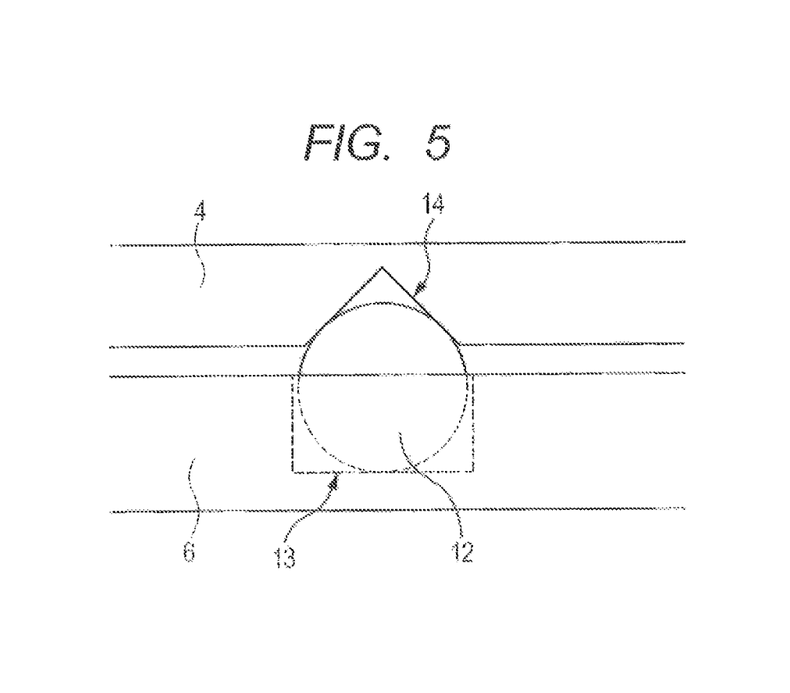
FIG. 5 is a view indicated by an arrow B of FIG. 4 for explaining a ball, a V-groove of the peripheral ring, and a grove of a connection ring which are used in a positioning mechanism according to one embodiment of the present invention.

On the other hand, in the lower surface of the peripheral ring 4 (the surface facing the lamp 11, that is, on the lifting mechanism 20 side), grooves 14 are formed (see FIG. 5). The cross-section of each groove 14 has a shape of V of the alphabet upside down (V-shaped cross-section) (hereinafter, referred to as V-grooves 14). The number, positions, and longitudinal directions of the V-grooves 14 are set so that the V-grooves 14 are located opposite to the respective grooves 13 of the connection ring 6. Accordingly, the direction of each V-groove 14 extends (longitudinal direction) is the same as a radial direction of the peripheral ring 4. If the depth of the V-grooves 14 is properly set, the balls 12 fit in the connection ring 6 are stabilized in contact with the slope surfaces of the V-grooves 14. Moreover, the diameter of the balls 12 is longer than the height of the recess portion (the groove depth). With this mechanism, the peripheral ring 4 and the lifting mechanism 20 be isolated from each other by the joint part of the peripheral ring 4 and the lifting mechanism 20 (the balls 12 as the linking members).

This embodiment can solve the above-described first problem.

In this embodiment, the peripheral ring 4 and the lifting mechanism 20, which moves up and down the peripheral ring 4, are not rigidly connected and are therefore not structurally restricted even if being thermally expanded. Specifically, the peripheral ring 4 and the connection ring 6 included in the lifting mechanism 20 are linked to each other through the balls 12, which are different members from both the peripheral ring 4 and connection ring 6. As described above, the peripheral ring 4 and connection ring 6 individually include grooves extending in the radial direction, and the balls 12 sandwiched therebetween can freely move in the radial direction. A ring-shaped component expands in diameter when being heated to high temperature. Even if the peripheral ring 4 and connection ring 6 are heated to high temperature and thermally expand in the radial direction, moreover, even if the peripheral ring 4 and connection ring 6 have a difference in speed of thermal expansion, the balls 12 can follow this expanding motion to a certain degree and are not structurally restricted. In other words, as described above, the longitudinal directions of the grooves 13 and the V-grooves 14 are set to the radial direction that the peripheral ring 4 and connection ring 6 expand. Accordingly, even if the peripheral ring 4 and connection ring 6 thermally expand at different coefficients of thermal expansion, the balls 12 can move both the grooves 13 and V-grooves 14. This can relax stress due to the thermal expansion in the radial direction (stress on the link between each ball 12 and peripheral ring 4 and stress on the link between each ball 12 and connection ring 6). In such a manner, in the first embodiment, the grooves 13 with the longitudinal direction set to the radial direction of the connection ring 6 and the V-grooves 14 with the longitudinal direction set to the radial direction function as the guide for relaxation of stress.

Even if the balls 12 cannot completely follow the motion of the peripheral ring 4 and connection ring 6 and slide on the grooves 13 and/or V-grooves 14 at the points of contact, excessive friction can be prevented. Because of the above-described reasons, any excessive thermal stress if not generated in the peripheral ring 4 and the connection ring 6 as a part of the lifting mechanism 20, so that the risk of breakage can be reduced.

In the first embodiment, the balls 12 are used as the linking members to link the peripheral ring 4 with the connection ring 6 included in the lifting mechanism 20, but the shape thereof is not limited to a sphere. In this embodiment, the linking member to link the peripheral ring 4 and lifting device 20 is provided as a member separated from both the peripheral ring 4 and lifting device 20, so that the peripheral ring 4 and the lifting device 20 can be linked by connection other than rigid connection. In other words, even if the peripheral ring 4 and connection ring 6 have different coefficients of thermal expansion, the linking member provided as a member separated from both the peripheral ring 4 and lifting device 20 can relax the difference.

In the light of relaxation of the difference in coefficient of thermal expansion, it is preferable that the linking member have such a shape that the linking member is slidable on at least both the wall surface of each groove (for example, the V-grooves 14) formed on the substrate supporting plate (for example, the peripheral ring 4) which is a linking target of the linking member and the wall surface of each groove (for example, the grooves 13) formed in the substrate supporting plate holding portion (for example, the connection ring 6) which the lifting device has. The linking member may have any shape such as a star-shaped sphere, a rugby ball-like shape, a cylinder, a rectangular cylinder, or a cuboid as long as the linking member can slide on both the substrate supporting plate and lifting device which are linked with the linking member. For the linking member is configured to be slidable on at least both of the substrate supporting plate and the lifting device which are linked with the linking members, even if the substrate supporting plate and the lifting device for lifting and lowering the substrate supporting plate thermally expand at different coefficients of thermal expansion, the difference in thermal expansion can be relaxes while the substrate supporting plate is supported on the lifting device.

The problem of escape of heat as the second problem can be solved by minimizing the area of contact between the peripheral ring 4 and connection ring 6. As described above, the peripheral ring 4 is supported on the connection ring 6 with the three balls 12 sandwiched between the both components instead of by plane. In other words, the balls 12 are each in contact with the peripheral ring 4 and connection ring 6 at two points, totally, at six points. The smaller the area of contact, the less the transferred heat. Moreover, in the first embodiment, the thermal conductivity of the balls 12 which are linking members for the peripheral ring 4 and connection ring 6 is set lower than that of the peripheral ring 4, so that the balls 12 serve as a screen against the flow of heat from the peripheral ring 4 to the connection ring 6. Accordingly, the heat escaping from the peripheral ring 4 to the connection ring 6 can be reduced.

In this embodiment, the lamp 11, peripheral ring 4, connection ring 6, and shafts 7 are sequentially arranged from top to bottom in the gravity direction. Accordingly, the peripheral ring 4 can prevent the lamp light from the lamp 11 from being incident onto the shafts 7. Furthermore, as described above, the transfer of heat from the heated peripheral ring 4 to the connection ring 6 can be reduced. Accordingly, heat due to the heating process is less likely to be transferred to the shafts 7 of the lifting device 20. It is therefore possible to reduce a temperature increase of space around the lifting device 20.

The first embodiment proposes a mechanism separating an connecting the peripheral ring 4 and the connection ring 6 as a structure under the peripheral ring 4 (that is, the lifting device 20) which are not rigidly connected to each other. By using the balls 12 as the linking members, the grooves 13 formed in the connection ring 6, and the V-grooves 14 formed in the peripheral ring 4, misalignment in positional relationship between the peripheral ring 4 and connection ring 6 can be reduced.

In the heating process, the peripheral ring 4 and the lifting device as the driving portion moving up and down the wafer W and the peripheral ring 4 increase in temperature together with the wafer W. The components are usually made of different materials and are irradiated by lamp light in different manners. Accordingly, as the components are repeatedly subjected to expansion due to heating and contraction due to a drop in temperature, the positional relationship between the peripheral ring 4 and the lifting device 20 as the structure under the peripheral ring 4 (the connection ring 6 in this embodiment) is more likely to change in the connection between the peripheral ring 4 and lifting device 20. The change in the positional relationship should be minimized. The first reason therefor is that the peripheral ring 4 according to the present invention takes a role of supporting the wafer W. The change of the position of the peripheral ring 4 causes misalignment of the wafer W or falling of the wafer W from the wafer supporting pins 5, thus affecting the delivery. The second reason is that the change in positional relationship between the wafer W and peripheral ring 4 changes the distribution of temperature in the wafer W.

However, in this embodiment, as the mechanism of connecting the peripheral ring 4 and lifting device 20, the balls 12, the grooves 13 formed in the connection ring 6, and the V-grooves 14 formed in the peripheral ring 4 are employed. To be specific, in the employed mechanism, the V-grooves 14 are formed in the lower surface of the peripheral ring 4 (the lower surface in the gravity direction) are formed while the oblong grooves 13 are formed in the upper surface of the connection ring 6 (the upper surface in the gravity direction), and the balls 12 are sandwiched between the V-grooves 14 and the grooves 13. The peripheral ring 4 can be reproducibly positioned by interactions of the wedge effect (wedge action) exerted when the balls 12 are in contact with the slopes of the V-grooves 14 and the combinations of the balls 12 and grooves 13 and the balls 12 and V-grooves 14, which are placed at three places.

In terms of obtaining the positioning effect by the wedge action exerted when balls are into contact with the slopes of the V-grooves as described above, it is preferably that the grooves formed at least one of the peripheral ring 4 and the connection ring 6 (grooves in which the linking members are inserted) by V-grooves.

According to the embodiment, the peripheral ring 4 and connection ring 6 (that is, the lifting device 20) are configured to be separated and are not rigidly connected structurally. Accordingly, even if the peripheral ring 4 is heated together with the wafer W in the process of heating, it is possible to reduce the risk of breakage due to excessive thermal stress by thermal expansion and interference between the components. Moreover, for the peripheral ring and connection ring are not rigidly connected, even if the peripheral ring 4 is contracted when the peripheral ring 4 is cooled, the risk of breakage can be also reduced.

Moreover, in the connection of the peripheral ring 4 and connection ring 6, the area of contact between the linking members and peripheral ring 4 is extremely small (only the point contact between the balls 12 and V-grooves 14). This can reduce heat escaping from the peripheral ring 4. Furthermore, the connection between the peripheral ring 4 and connection ring 6 includes the mechanism for positioning the peripheral ring 4. This can reduce misalignment of the wafer W and peripheral ring 4 also in continuous treatment. The positioning mechanism does not need to include a sensor or an actuator and has a simple structure of low cost.

Second Embodiment

In the case of heating and cooling the wafer W in a same chamber (especially in a vacuum chamber), it is important how quick the heated wafer W and peripheral ring 4 are cooled. This is very difficult problem in the case of an apparatus for processing the wafer W in vacuum in particular. For apparatuses of manufacturing electronic devices, the number of processed wafers per unit time (throughput) is important. In the case of an apparatus for heating a wafer W in vacuum, as described in the first embodiment, when light of the lamp 11 installed outside of the vacuum chamber 1 is incident through the light inlet window 10 provided in one side of the vacuum chamber 1, the wafer W placed facing the lamp 11 can be effectively heated by radiation.

On the other hand, there are very few effective means for cooling. This is because heat transfer hardly occurs in vacuum. The major mechanism for cooling can include only heat transfer by radiation. Accordingly, in some cases, a proper type of gas is introduced to the chamber in the process of cooling, and the pressure in the chamber is increases, so that heat transfer is thus promoted using the gas as a medium. However, the gas does not have an enough heat transfer coefficient, and it is difficult to perform efficient cooling. Moreover, in some kinds of processes, it is preferable that wafers are held in vacuum during the cooling process.

This embodiment includes a substrate cooling mechanism for cooling a substrate and a substrate supporting plate cooling mechanism for cooling the substrate supporting plate. Specifically, the peripheral ring 4 supporting the wafer W is irradiated by lamp light from the lamp 11 and heated at the upper position (the upper side in the gravity direction) of the vacuum chamber 1 as a processing chamber. On the other hand, in the lower part of the vacuum chamber 1 (the lower side in the gravity direction, a cooling stage as the substrate cooling mechanism on which the wafer W can be placed is provided and can forcibly cool the heated wafer W. Moreover, under the cooling stage, a cooling plate as the substrate supporting plate cooling mechanism is provided. On the cooling plate, at least a region 4a of the peripheral ring 4 opposite to the outer edge of the wafer W can be placed. The cooling plate is capable of cooing at least the region 4a of the heated peripheral ring 4 opposite to the outer edge of the wafer W. In each of the cooling stage and cooling plate, a heat removal means such as a mean of flowing cooling water is provided inside.

Figure 7:
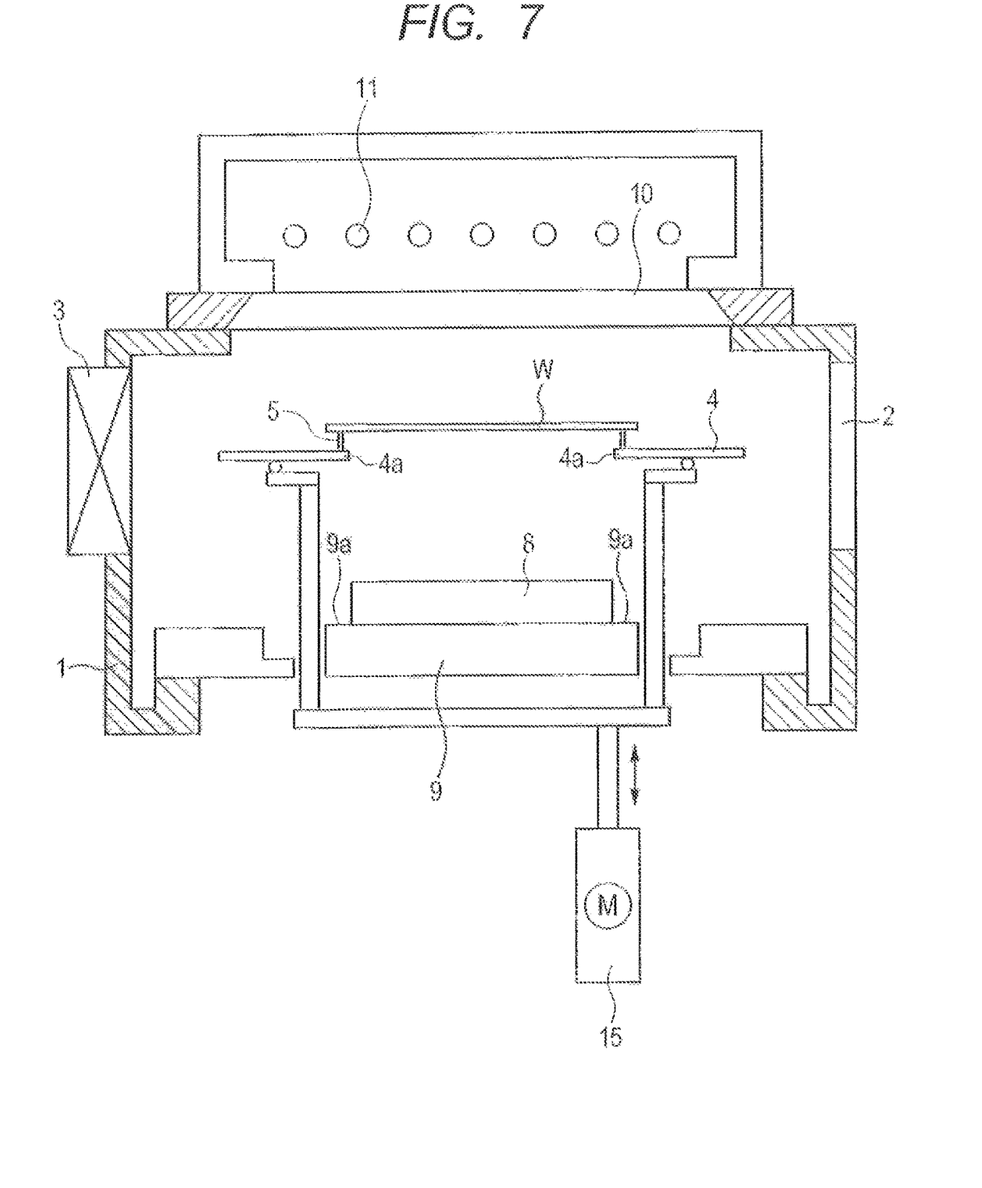
FIG. 7 is a schematic view of the substrate heat treatment apparatus according to one embodiment of the present invention.
Figure 8:
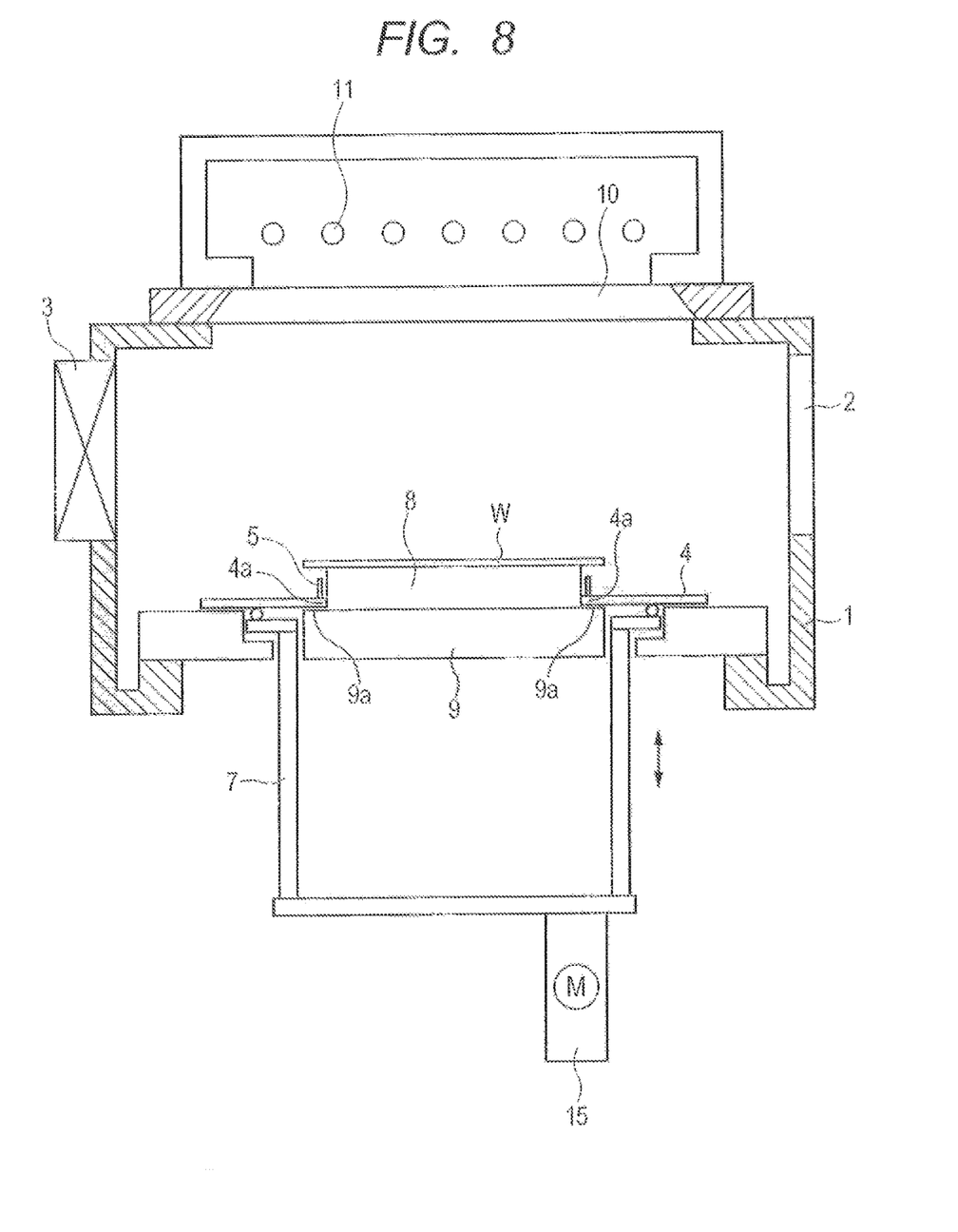
FIG. 8 is a schematic view of the substrate heat treatment apparatus according to one embodiment of the present invention.

In the second embodiment, as shown in FIG. 7, in the substrate heat treatment apparatus shown in FIG. 1, a cooling stage 8, on which the wafer W can be placed, is provided under the peripheral ring 4 in the gravity direction. The cooling stage 8 is configured to cool the wafer W placed thereon. Moreover, under the cooling stage 8 in the gravity direction, a cooling plate 9 is placed. On the cooling plate 9, at least the region 4a of the peripheral ring 4 opposite to the outer edge of the wafer W is placed. The cooling plate 9 is configured to cool the region 4a placed thereon. Each of the cooling stage 8 and cooling plate 9 includes a passage formed therein, through which cooing water can be flown.

Figure 6:
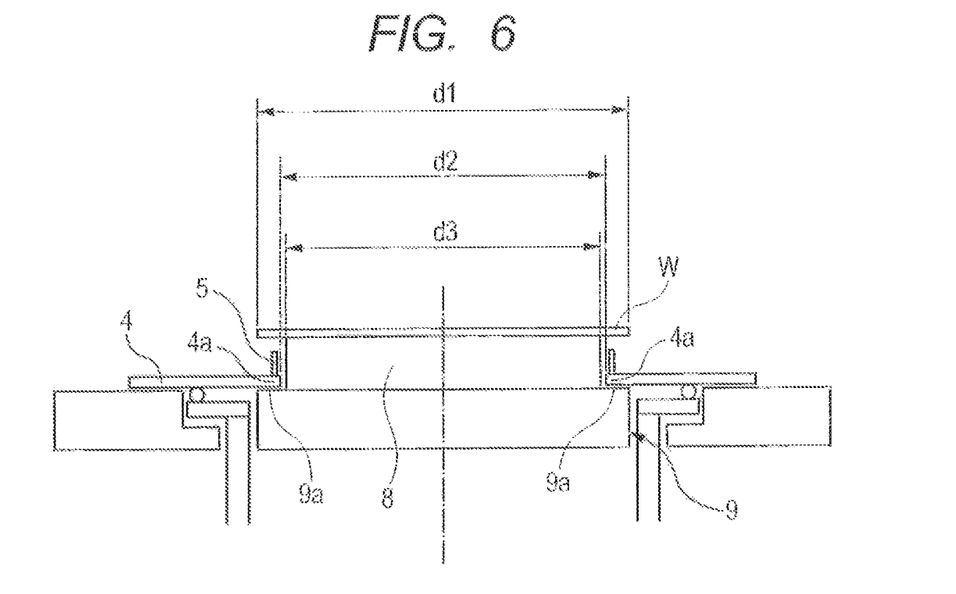
FIG. 6 is a structure view around a cooling stage of a substrate heating apparatus according to one embodiment of the present invention.

Herein, a description is given of an operation to place the wafer W supported by the peripheral ring 4 on the cooling stage. FIG. 6 shows the shapes and arrangement of the wafer W, peripheral ring 4, and cooling stage 8. As shown in the drawing, inner diameter d2 of the peripheral ring 4 is slightly smaller than outer diameter d1 of the wafer W. The wafer supporting pins 5 are arranged at equal intervals on the circumference in the inner edge of the peripheral ring 4 and support the wafer W horizontally on the tips of the arranged plural wafer supporting pins 5. The wafer W and peripheral ring 4 are located concentrically. The cooling stage 8 is located in lower part (at the bottom, for example) of the vacuum chamber 1 concentrically with the wafer W and peripheral ring 4. Diameter d3 of the cooling stage 8 is further smaller than the inner diameter of the peripheral ring 4 (d1>d2>d3). The diameter of the cooling plate 9 is larger than the diameter d3 of the cooling stage 8. The cooling plate 9 is placed so that the lower surface of the cooling stage 8 is in contact with the upper surface of the cooling plate 9 and the outer edge of the upper surface of the cooling plate 9 is exposed. In the second embodiment on an exposed outer edge 9a of the cooling plate 9, the region 4a of the peripheral ring 4 opposite to the outer edge of the wafer W is placed.

The peripheral ring 4 supporting the heated wafer W is driven by the actuator 15 and is lowered. If the aforementioned structure has enough space to accommodate the region 4a of the peripheral ring 4 moved to the lower outside of the cooling stage 8 (a margin; an exposed outer edge 9a of the cooling plate 9), the region 4a being opposite to the outer edge of the wafer W, when the tips of the wafer supporting pins 5 reach the same level as the surface of the cooling stage 8 during the process of lowering of the peripheral ring 4, the wafer W is transferred to the cooling stage 8.

Furthermore, a description is given of the cooling stage 8 cooling the peripheral ring 4. As described above, the peripheral ring 4 with the wafer W removed during the process of lowering is further lowered by the lifting device 20. Herein, the cooling plate 9 is provided in the periphery of the cooling stage 8 under the same, and the peripheral ring 4 is placed thereon. The peripheral ring 4 can be thus effectively cooled. The cooling plate 9 is a member which is provided with a heat removal means such as a means of flowing cooling water and includes a planar portion on which the peripheral ring 4 can be placed (the exposed outer edge 9a). The cooling plate 9 is a component provided within the vacuum chamber 1 or a part of the vacuum chamber 1 (the bottom surface thereof or the like).

In the aforementioned configuration to effectively cool the heated wafer W and peripheral ring 4, the configuration characteristic to the present invention, which is described in the first embodiment, effectively operates and can increase the reliability of the mechanism. The peripheral ring 4 is not rigidly connected to the structure portion (the lifting device 20) under the peripheral ring 4 in the gravity direction and is placed on the connection ring 6 with the balls 12 interposed therebetween. If the peripheral ring 4 is rigidly connected to the structure portion under the peripheral ring 4 by screw fastening or the like, the peripheral ring 4 could be excessively pressed against the cooling plate 9 when being placed on the cooling plate 9. If the peripheral ring 4 is excessively pressed, the peripheral ring 4 itself or the up and down driving portion (the lifting device 20) linked to the same could be subject to component breakage or deformation. Moreover, when the peripheral ring 4 stops short of the cooling plate 9 with a slight gap between the peripheral ring 4 and cooing plate 9, heat transfer by contact is not adequately caused, and effective cooling cannot be performed.

In the mechanism according to the second embodiment, when the peripheral ring 4 is placed on the cooling plate 9 and the connection ring 6 is then further lowered, the peripheral ring 4 is separated from the connection ring 6 and can be completely placed on the cooling plate 9. Accordingly, the peripheral ring 4 is not pressed against the cooling plate 9, and there is no gap formed between the peripheral ring 4 and cooling plate 9. Moreover, the peripheral ring 4 is contracted when being cooled. The mechanism according to the second embodiment in which the peripheral ring 4 and connection ring 6 are separated from each other during the cooing process is not mechanically restricted. This can reduce the risk of breakage.

After the processing of one wafer W is finished and the peripheral ring 4 is cooled, the peripheral ring 4 is driven by the lifting device 20 to move upward again. The next wafer W is placed thereon, and the process is continued. In this movement, it is necessary to eliminate or reduce the difference in position of the peripheral ring 4 from the position at which the previous wafer W is processed. The reason therefor is the same as that in the aforementioned case. The positioning mechanism provided to the linking portion between the peripheral ring 4 and connection ring 6 effectively acts on the above requirement.

Hereinafter, the procedure of the process in the second embodiment is described.

(1) A wafer W is delivered from the wafer delivery system into the vacuum chamber 1 through the wafer inlet port 3. The peripheral ring 4 is located at a proper position to wait for the wafer W. In cooperation with am arm of the wafer delivery robot, the peripheral ring 4 receives the wafer W on the tips of the three wafer supporting pins 5, which are stood on the peripheral ring 4.

(2) The lifting device 20 raises the peripheral ring 4 with the wafer W thereon to the position for irradiation of lamp light (heating position) and stops the same. At this position, the wafer W is irradiated by the lamp light from the lamp 11 to be heated (FIG. 7). Herein, it is possible to set plural positions for irradiation within a movable range of the peripheral ring 4.

(3) After heating, the lifting device 20 moves the peripheral ring 4 with the heated wafer W thereon downward in the vacuum chamber 1. In the process of lowering, only the wafer W is transferred to the stage 8. The wafer W placed on the stage 8 is then cooled. Herein, for the wafer W has high temperature just after heating, the wafer W waits in some cases before being placed on the cooling stage 8 until the temperature of the wafer W falls to a proper temperature in order to prevent breakage of the wafer W due to heat shock.

(4) The lifting device 20 further lowers the peripheral ring 4 with the wafer W transferred to the cooling stage 8 and places the region 4a of the peripheral ring 4, which is opposite to the outer edge of the wafer W, on the exposed outer edge 9a of the cooling plate 9 for cooling the peripheral ring 4. The peripheral ring 4 is separated from the connection ring 6 at this position.

(5) The lifting device 20 further lowers the connection ring 5 with the peripheral ring 4 left on the cooing late 9 and stops at the determined lowest position.

(6) Subsequently, the procedure proceeds to the step of carrying the wafer W which has finished cooling to the outside of the chamber 1.

The lifting device 20 raises the connection ring 6 to connect the same to the peripheral ring 4 placed on the cooling plate 9. The peripheral ring 4 is positioned by the balls 12, grooves 13, and V-grooves 14. To be specific, the oblong grooves 13 are formed on a circumference of the connection ring 6, and the balls 12 are fit in the respective grooves 13. The balls 12 are provided at three places on the circumference of the connection ring 6 as described above. The peripheral ring 4 is placed on the connection ring 6 with the balls 12 interposed therebetween.

(7) By being driven by the lifting device 20, the peripheral ring 4 and connection ring 6 are integrated and continue moving up. When the tips of the wafer supporting pins 5 stood on the peripheral ring 4 reach the level of the surface of the stage 8, the wafer W is raised from the stage 8.

(8) The lifting device 20 moves up the wafer W supported by the three wafer supporting pins 5 together with the peripheral ring 4 and connection ring 6 and stops at a proper position (a delivery position). The wafer W is carried out through the wafer inlet port 3 in cooperation with the arm of the wafer deliver robot.

According to the second embodiment, as described above, in the lamp heating apparatus, the ring (peripheral ring) placed around the periphery of each wafer to provide uniform temperature in the wafers W can be effectively cooled after each wafer is processed. This contributes stable operation of the apparatus as well as an increase in process performance.

The peripheral ring 4 is moved up and down by the actuator 15 and is placed on the cooling plate 9. At this time, the peripheral ring 4 is separated from the driving portion including the actuator (the lifting device 20. Accordingly, this prevents the peripheral ring 4 from being pressed against the cooling plate 9 an broken in the process of cooling. The peripheral ring 4 is naturally placed on the cooling plate 9. Accordingly, the peripheral ring 4 can be in contact with the cooling plate 9 without a gap therebetween, thus implementing effective cooling.

Third Embodiment

In a third embodiment, the cooling stage 8 of the second embodiment may be provided with an electrostatic chuck (ESC).

In the case of using the electrostatic chuck in the cooling stage 8 on which the wafer W is placed, it is necessary to provide a proper dechucking means. For electrostatic adsorption, voltage is applied across the wafer W and the cooling stage 8 provided with a dielectric layer, and the wafer W is adsorbed and fixed by the force generated therebetween. In the case of dechucking the wafer W, application of voltage is stopped to release the adsorption. However, some of electric charges remain in the dielectric layer (residual electric charges), and the cooling stage 8 still has adsorption force. If the wafer supporting pins are intended to raise and hold the wafer in this state, the remaining adsorption force operates as a repulsive force, thus causing problems of jump, shift, and breakage in a not-intended direction.

To solve the above problem, in this embodiment, before the wafer W is dechucked from the cooling stage 8 to which the wafer W is adsorbed by the electrostatic chuck, the wafer W is earthed to remove the residual electric charges. Accordingly, it is effective to form the wafer supporting pins 5, peripheral ring 4, calls 12 and connection ring 6 of electric conductive materials and form a ground circuit which can earth the connection ring 6 according to the need. Moreover, the structure thereof needs to be configured to reliably release electric charges of the wafer W. Accordingly, it is desirable that the ground circuit is not blocked by any insulator.

Figure 9:
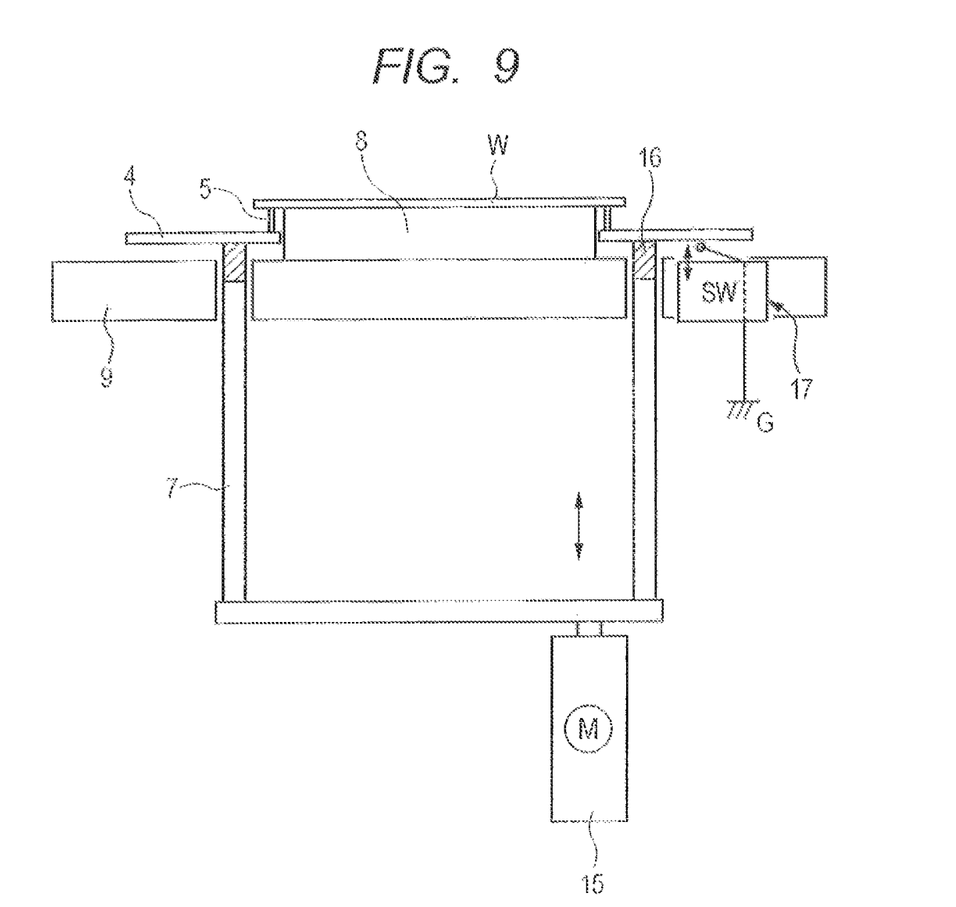
FIG. 9 is a view showing a wafer detachment mechanism according to one embodiment of the present invention.

In FIG. 9, the wafer supporting pins 5 and peripheral ring 4 are made of electrically conductive materials to provide the substrate supporting plate with electric conductivity. The balls 12 as the linking members are formed of a material having electric conductivity. Furthermore, the connection ring 6 as a portion of the lifting device 20 on which the substrate supporting plate is placed is made of an electric conductive material, and the region of the shaft 7 connected with the connection ring 6 is a non-conductive portion composed of a non-conductive material. In such a configuration, the ground circuit can be formed by providing a switch (a mechanical contact point) 17. The switch 17 is switched when needed to connect the connection ring 6 to the ground G. The residual electric charges in the wafer W can be released through the ground circuit.

The wafer supporting pins 5 and the balls 12 are desirably made of materials with low heat transfer coefficients in the light of reduction in escaping heat. Accordingly, the wafer supporting pins 5 and balls 12 can be made of quartz or ceramics, which are not electrically conductive, for example. In such a case, the mechanical contact point (switch 17) is provided at the place where the ground circuit is not continuous (for example, at the peripheral ring 4) and is operated at proper time to provide the same effect.

According to the third embodiment, when the cooling stage 8 is electrostatically adsorbed by the electrostatic chick, the residual electric charges in the wafer W are reliably earthed to prevent wafer detachment error.

The aforementioned embodiments and process procedure show the cases where each embodiment of the present invention is applied to an apparatus to heat wafers in vacuum. The lamp heating is also performed in atmospheric pressure or in nitrogen-substituted space in some cases. The application of the mechanism proposed in each embodiment of the present invention is not limited to vacuum apparatuses.

The invention claimed is:

1. A substrate heat treatment apparatus to perform heat treatment for a substrate comprising:
   a substrate supporting plate that is a ring-shaped plate capable of supporting the substrate;
   a lifting mechanism configured to hold the substrate supporting plate and raise and lower the substrate supporting plate;
   a linking member linking the substrate supporting plate and the lifting mechanism, the linking member having lower thermal conductivity than that of the substrate supporting plate; and
   a heating means for heating the substrate supported by the substrate supporting plate from above the substrate supporting plate in the gravity direction,
   wherein the linking member is a member different from both the substrate supporting plate and the lifting mechanism,
   the lifting mechanism includes a raising and lowering means for raising and lowering the substrate supporting plate between a first position close to the heating means and a second position distant from the heating means,
   the linking member is a ball,
   the substrate supporting plate includes a first groove provided in a lower surface that is a part of the substrate supporting plate in the gravity direction,
   the lifting mechanism includes a substrate supporting plate holding portion that is a ring-shaped plate capable of holding the substrate supporting plate and a second groove provided in an upper surface that is part of the substrate supporting plate holding portion in the gravity direction,
   a longitudinal direction of the first groove coincides with a radial direction of the substrate supporting plate,
   a longitudinal direction of the second groove coincides with a radial direction of the substrate supporting plate holding portion, and
   the lifting mechanism holds the substrate supporting plate with the ball sandwiched between the first and second grooves.

2. The substrate heat treatment apparatus according to claim 1, wherein at least one of the first and second grooves is a V-groove having a V-shaped cross-section, and the first groove, the second groove, and the ball form a positioning mechanism by wedge action exerted when the ball is in contact with a slope surface of the V-groove.

3. The substrate heat treatment apparatus according to claim 2, wherein the first groove is a V-groove, and the ball has a diameter longer than a height of the recess of the second groove.

* * * * *